US010965305B1

(12) United States Patent
Ramaraju et al.

(10) Patent No.: US 10,965,305 B1
(45) Date of Patent: Mar. 30, 2021

(54) MULTI-PHASE SAMPLING TIME-TO-DIGITAL CONVERTER (TDC) FOR JITTER MEASUREMENT

(71) Applicant: QUALCOMM Incorporated, San Diego, CA (US)

(72) Inventors: Ravindraraj Ramaraju, Round Rock, TX (US); Elhossin Abdelmonem Elshafey, Cork (IE); Masoud Zamani, San Diego, CA (US); Elham Zamanidoost, San Diego, CA (US)

(73) Assignee: QUALCOMM INCORPORATED, San Diego, CA (US)

(*) Notice: Subject to any disclaimer, the term of this patent is extended or adjusted under 35 U.S.C. 154(b) by 0 days.

(21) Appl. No.: 16/793,661

(22) Filed: Feb. 18, 2020

(51) Int. Cl.
*H03M 1/12* (2006.01)
*G04F 10/00* (2006.01)
*H03M 1/50* (2006.01)
*H03K 19/20* (2006.01)
*H03K 3/03* (2006.01)

(52) U.S. Cl.
CPC ........ *H03M 1/1245* (2013.01); *G04F 10/005* (2013.01); *H03K 3/0315* (2013.01); *H03K 19/20* (2013.01)

(58) Field of Classification Search
CPC ... H03M 1/1245; H03K 3/0315; G04F 10/105
USPC ................................................. 341/155, 122
See application file for complete search history.

(56) References Cited

U.S. PATENT DOCUMENTS

| 9,432,009 | B2* | 8/2016 | Whatmough | .......... H03K 5/135 |
| 2002/0186159 | A1* | 12/2002 | Reinhold | ............. H04L 7/0037 |
| | | | | 341/155 |
| 2007/0273450 | A1* | 11/2007 | Burton | ................. H03K 3/0315 |
| | | | | 331/57 |

OTHER PUBLICATIONS

Kuo-Hsing Cheng et al., "A Time-to-Digital Converter Using Multi-Phase-Sampling and Time Amplifier for All Digital Phase-Locked Loop," 2010 IEEE, pp. 285-288.
Belal M. Helal et al., "A Highly Digital MDLL-Based Clock Multiplier That Leverages a Self-Scrambling Time-to-Digital Converter to Achieve Subpicosecond Jitter Performance," IEEE Journal of Solid-State Circuits, vol. 43, No. 4, Apr. 2008, pp. 855-863.
Kyu-Dong Hwang et al., "An Area Efficient Asynchronous Gated Ring Oscillator TDC With Minimum GRO Stages," 2010 IEEE, pp. 3973-3976.

* cited by examiner

*Primary Examiner* — Peguy Jean Pierre
(74) *Attorney, Agent, or Firm* — Patterson+Sheridan, L.L.P.

(57) ABSTRACT

Certain aspects are directed to a time-to-digital converter (TDC) that allows for a more accurate jitter measurement. The TDC generally includes a ring oscillator (RO) having a plurality of taps and configured to generate a plurality of RO signals at the plurality of taps, a counter having an input coupled to an oscillating node, and at least two sampling circuits, each having an input coupled to an output of the counter. In certain aspects, the at least two sampling circuits are configured to sample a count signal at the output of the counter based on at least two of the plurality of RO signals at the plurality of taps.

20 Claims, 4 Drawing Sheets

MULTI-PHASE SAMPLING TIME-TO-DIGITAL CONVERTER (TDC) FOR JITTER MEASUREMENT

FIELD OF THE DISCLOSURE

The present disclosure generally relates to electronic circuitry and, more particularly, to circuitry for time-to-digital conversion.

DESCRIPTION OF RELATED ART

Universal Serial Bus (USB) is an industry standard for cables, connectors, and protocols for communication between computers and peripherals. USB 2.0 was designed to provide a high maximum signaling rate of 480 Mbit/s. One design challenge of USB and other communication systems is jitter. Jitter generally refers to the variation in periodicity of a signal from its target frequency.

SUMMARY

Certain aspects are directed to a time-to-digital converter (TDC). The TDC generally includes a ring oscillator (RO) having a plurality of taps and configured to generate a plurality of RO signals at the plurality of taps, a counter having an input coupled to an oscillating node, and at least two sampling circuits, each having an input coupled to an output of the counter. In certain aspects, the at least two sampling circuits are configured to sample a count signal at the output of the counter based on at least two of the plurality of RO signals at the plurality of taps.

Certain aspects are directed to a method for time-to-digital conversion. The method generally includes generating, with a RO, a plurality of RO signals at a plurality of taps of the RO; generating, via a counter, a count signal based on a gated oscillating signal; and sampling, via at least two sampling circuits, the count signal based on at least two of the plurality of RO signals.

Certain aspects are directed to an apparatus for time-to-digital conversion. The apparatus generally includes means for generating a plurality of oscillator signals at a plurality of taps of a RO; means for generating, via a counter, a count signal based on a gated oscillating signal; and means for sampling, via at least two sampling circuits, the count signal based on at least two of the plurality of oscillator signals.

Other aspects, advantages, and features of the present disclosure will become apparent after review of the entire application, including the following sections: Brief Description of the Drawings, Detailed Description, and the Claims.

DETAILED DESCRIPTION

Figure 1:
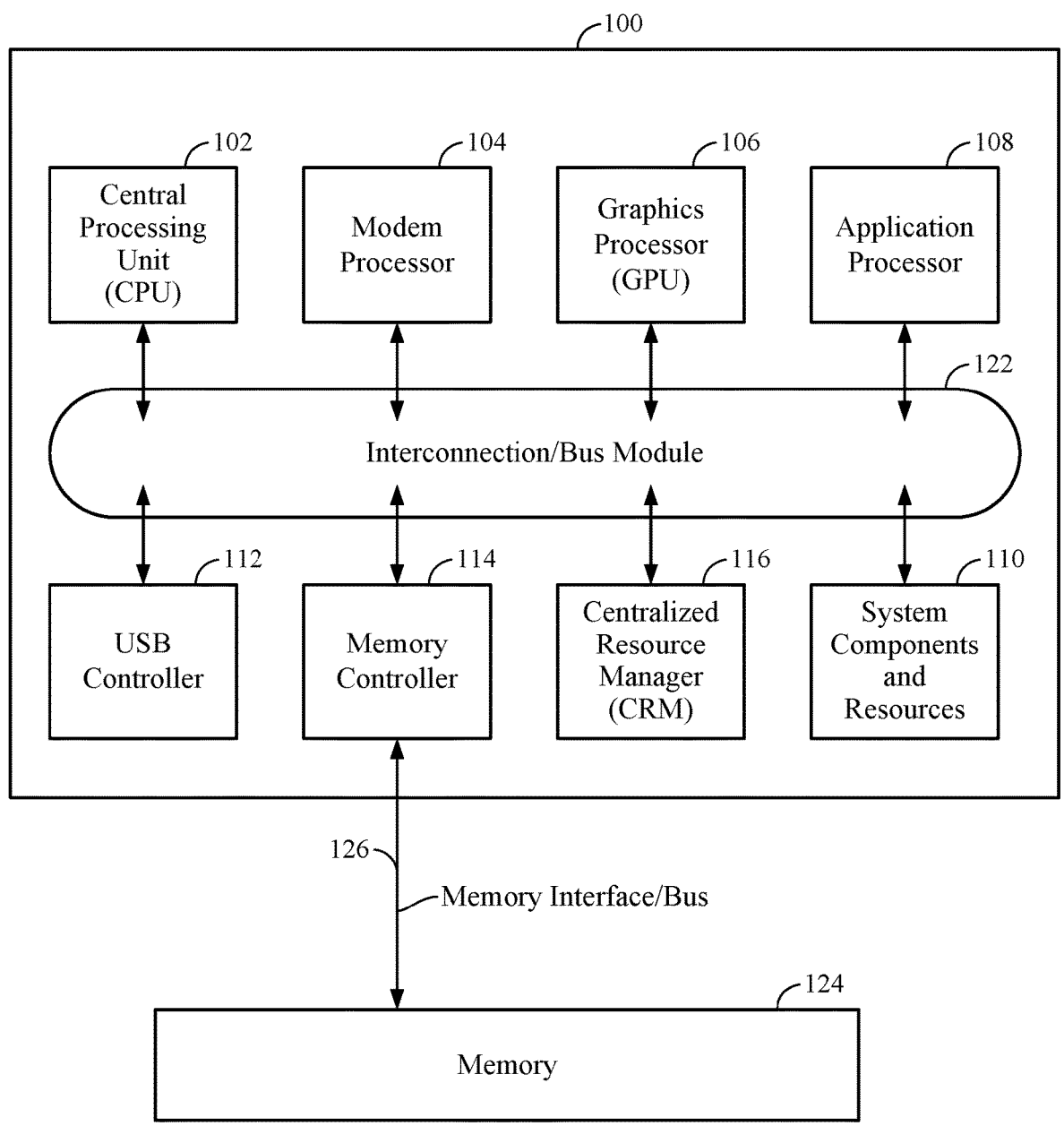
FIG. 1 illustrates an example implementation of a system-on-a-chip (SoC).

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, netbooks, ultra-books, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., central processing unit (CPU) cores, etc.) configured to read and execute program instructions. The term "multiprocessor" is used herein to refer to a system or device that includes two or more processing units configured to read and execute program instructions.

The term "system on chip" (SoC) is used herein to refer to a single IC chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., read-only memory (ROM), random access memory (RAM), flash, etc.), and resources (e.g., timers, voltage regulators, oscillators, etc.), any or all of which may be included in one or more cores.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Example SoC

FIG. 1 illustrates example components and interconnections in a system-on-chip (SoC) 100 suitable for implementing various aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) controller 112, one or more memory controllers 114, and a centralized resource manager (CRM) 116. In certain aspects, the USB controller 112 may perform jitter measurements using a multi-phase sampling circuit, as described in more detail herein. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture. Communications may also be provided by advanced interconnects, such as high performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously. The memory controller 114 may be a specialized hardware module configured to manage the flow of data to and from a memory 124 via a memory interface/bus 126.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

Example Techniques for Multi-Phase Sampling Time-to-Digital Converter (TDC)

USB 2.0 physical layer (PHY) may have jitter above specification due to process variations, in some cases. Thus, an on-die jitter measurement and screening of USB 2.0 PHY parts is important. The challenge in measuring and screening the USB PHY jitter is implementing high resolution jitter measurement. When using a free-running counter to measure jitter, a clock frequency above 10 GHz for the counter may be used to achieve the high resolution for jitter measurement. However, operating a clock for a free-running counter above 10 GHz has various design challenges and adds additional complexity and area making the on-die jitter measurement difficult to implement. Certain aspects of the present disclosure provide a multi-phase sampling technique that allows for a relatively accurate jitter measurement by reducing uncertainty associated with a counter output used to sample a duration of an enable period, as described in more detail herein.

Figure 2:
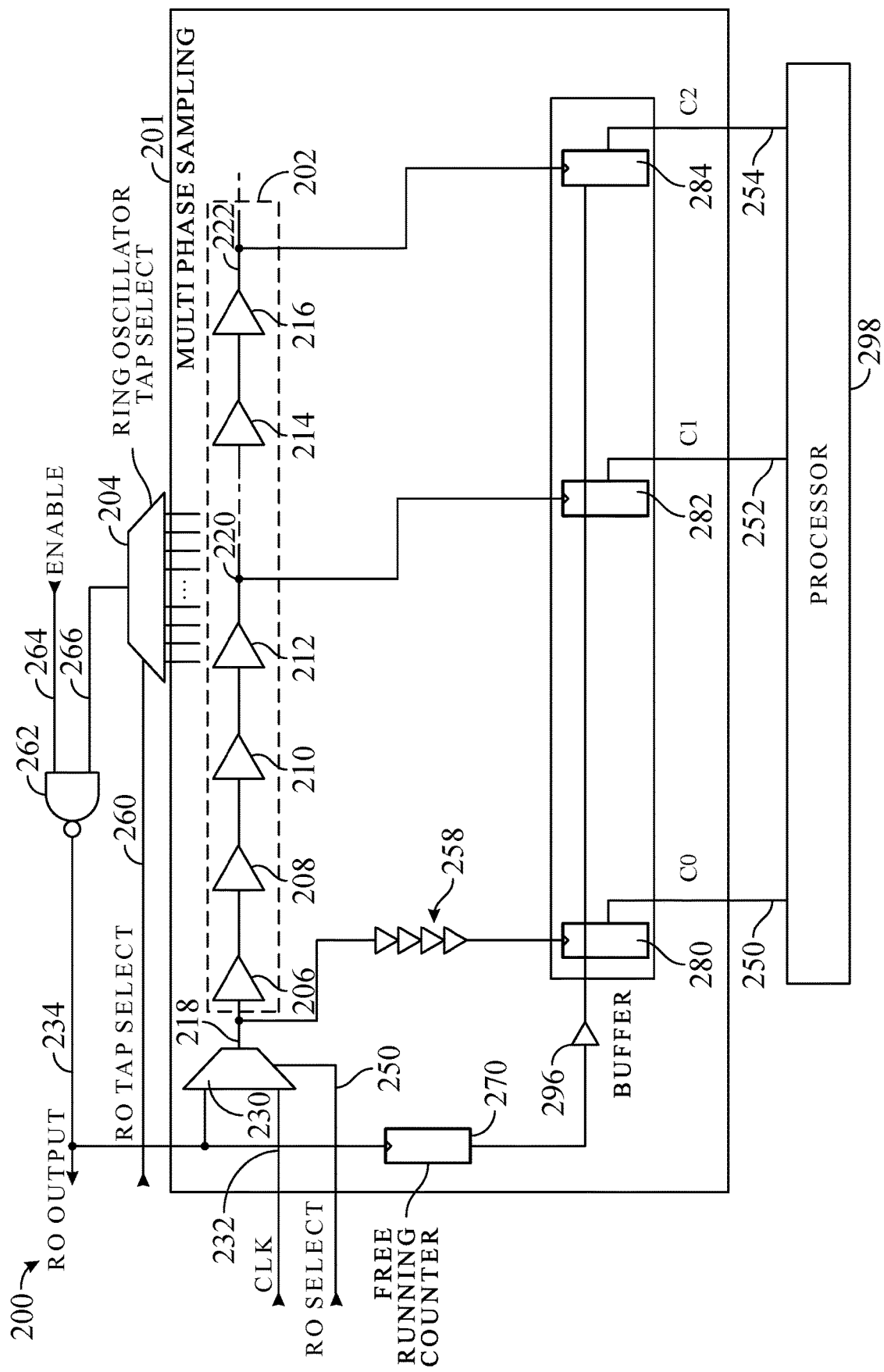
FIG. 2 illustrates a multi-phase sampling circuit for a ring oscillator (RO), in accordance with certain aspects of the present disclosure.

FIG. 2 illustrates a time-to-digital converter (TDC) 200 having a multi-phase sampling circuit 201 having a ring oscillator (RO) 202, in accordance with certain aspects of the present disclosure. As illustrated, the RO 202 includes multiple inverters (e.g., inverters 206, 208, 210, 212, 214, 216), the input (or output) of each of the inverters being referred to herein as a tap of the RO 202 (also referred to as an output of the RO 202). The RO signal at each of the taps of the RO 202 has a different phase. For example, the RO signal at tap 218 may be at 0° phase, the RO signal at tap 220 may be at 120° phase, and the RO signal at tap 222 may be at 240° phase.

As illustrated, the multi-phase sampling circuit 200 may include a multiplexer 230. The inputs of the multiplexer 230 may be coupled to a clock (CLK) input 232 and an RO output 234 (e.g., also referred to as "an oscillating node"). An RO select signal 250 may be provided to the multiplexer 230 to select one of the CLK input 232 and the RO output 234, and provide the selected one of the CLK input 232 and the RO output 234 to the input of the inverter 206.

As illustrated, each of the taps of the RO 202 may be coupled to an input of a multiplexer 204. The output 266 of the multiplexer 204 corresponds to an RO signal at one of the taps of the RO 202, depending on a RO tap select signal 260. The output 266 of the multiplexer 204 may be provided to an input of a NOT AND (NAND) gate 262, the other input of the NAND gate 262 being coupled to an enable node 264 receiving an enable signal as shown. Thus, the RO output 234 at the output of the NAND gate 262 may be enabled (e.g., represent one of the RO signals at one of the taps of the RO 202) when the enable signal at the enable node 264 is logic high. In other words, if the enable signal is logic low, the output of the NAND gate 262 will be logic high regardless of the logic state of the selected RO signal. However, if the enable signal is logic high, the signal at the output of the NAND gate 262 will be the inverse of the selected RO signal.

In certain aspects, a free-running counter 270 may be used to count a number of clock cycles at the RO output 234 during an enable period for which the enable signal at the enable node 264 is logic high. In other words, the free-running counter 270 begins counting when the enable period transitions to logic high and the output 266 of the multiplexer 204 transitions from logic low to logic high and stops counting when the enable signal transitions back to logic low, and thus, provides a digital count value that represents the duration of the enable period to be used for jitter measurement. Thus, the free-running counter 270 is used to implement a time-to-digital converter (TDC), used to convert the time associated with the enable period to a digital value.

The count signal at the output of the counter 270 may be used to determine a jitter associated with the RO 202. However, merely using the output of the free-running counter 270 for jitter measurements may be relatively inaccurate because depending on whether the enable period ends before a rising edge at the RO output 234, or after the rising edge at the RO output 234, the counter value may vary by a single count value. For example, if the enable period ends slightly prior to a rising edge at the RO output 234, the counter value may be equal to n, n being an integer equal to or greater than 1. However, if the enable period ends slightly after the rising edge at the RO output 234, the counter value may be equal to n+1. Therefore, there is a certain level of uncertainty in the digital representation of the duration of the enable period, depending on the frequency of the free-running counter 270. Operating the free-running counter 270 at a high frequency (e.g., 10 GHz) to reduce this uncertainty comes with various design challenges and adds additional complexity and area, making on-die jitter measurement difficult to implement.

In certain aspects, a multi-phase sampling technique may be used to reduce the uncertainty associated with the time-to-digital conversion. For example, the multi-phase sampling circuit 200 may include sampling circuits 280, 282, 284, each configured to sample the count signal at the output of the counter 270 at a different phase associated with the RO 202. In certain aspects, a buffer 296 may be coupled between the counter 270 and the sampling circuits 280, 282, 284. The sampling circuit 280 may be coupled to the tap 218 (e.g., through a delay element 258) and configured to sample the output of the counter 270 at a falling edge of the RO signal (or at a time after the falling edge corresponding to the delay element 258) at tap 218. The sampling circuit 282 may be coupled to the tap 220 and configured to sample the output of the counter 270 at a falling edge of the RO signal at tap 220. The sampling circuit 284 may be coupled to the tap 222 and configured to sample the output of the counter 270 at a falling edge of the RO signal at tap 222. The output of each of the sampling circuits 280, 282, 284 may be provided to a processor 298 and used to determine the duration of the enable period and more accurately measure jitter associated with the RO 202. In some cases, the output of the counter 270 may be sampled based on additional taps of the RO 202 via additional sampling circuits to provide for a more accurate detection of the duration of the enable period and jitter measurement. Moreover, while the sampling circuits 280, 282, 284 are used to sample the output of the counter 270 based on RO signals at respective taps 218, 220, 222, the sampling circuits may be configured to sample the output of the counter 270 based on different taps of the RO.

Figure 3:
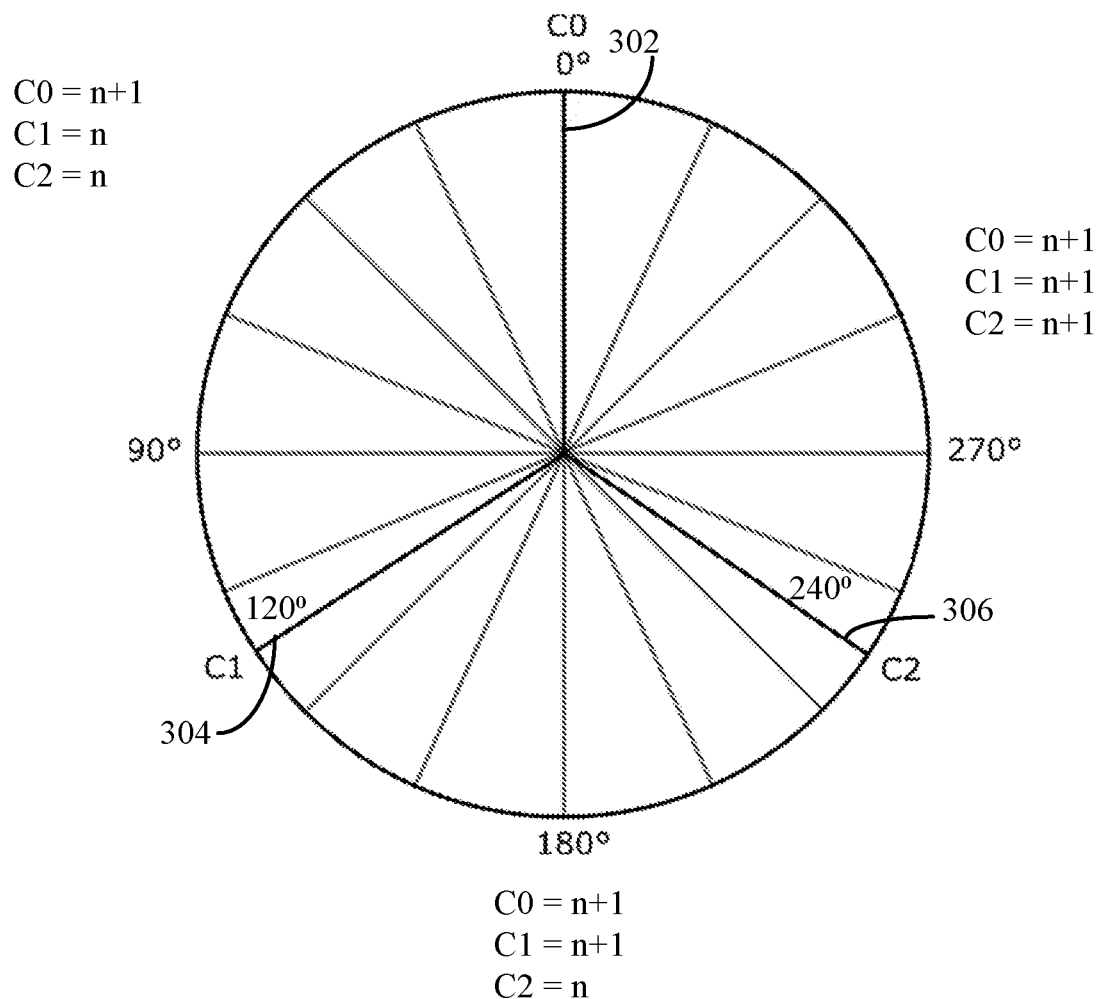
FIG. 3 illustrates a phasor diagram showing phases associated with various taps of an RO, in accordance with certain aspects of the present disclosure.

FIG. 3 illustrates a phasor diagram 300 showing the phases associated with various taps of the RO 202, in accordance with certain aspects of the present disclosure. The C0 output 251 of the sampling circuit 280 provides a sample of the output of the counter 270 at a time corresponding to 0° phase 302 of the RO 202 (e.g., at tap 218), the C1 output 252 of the sampling circuit 282 provides a sample of the output of the counter 270 at a time corresponding to 120° phase 304 of the RO 202 (e.g., at tap 220), and the C3 output 254 of the sampling circuit 284 provides a sample of the output of the counter 270 at a time corresponding to 240° phase 306 of the RO 202 (e.g., at tap 222).

Due to propagation delay associated with the counter 270, a delay element 258 may be implemented at the input of the sampling circuit 280 that is configured to sample the count signal based on a 0° phase RO output (e.g., if the rising edge of the enable signal is synced with the 0° phase RO output). The delay element 258 may be coupled between the tap 218 and the sampling circuit 280. In this case, the sampling circuit 280 may sample the output of the counter 270 at the time corresponding to 0° phase of the RO output plus a delay associated with the delay element 258.

As illustrated in FIG. 3, if the enable period ends between a time corresponding to 0° phase 302 of the RO and a time corresponding to 120° phase 304 of the RO, the C0 output may be equal to n+1, the C1 output may be equal to n, and the C2 output may be equal to n. If the enable period ends between a time corresponding to 120° phase 304 of the RO and a time corresponding to 240° phase 306 of the RO, the C0 output may be equal to n+1, the C1 output may be equal to n+1, and C2 output may be equal to n. If the enable period ends between a time corresponding to 240° phase 306 of the RO and a time corresponding to 0° phase 302 of the RO, the C0 output may be equal to n+1, the C1 output may be equal to n+1, and the C2 output may be equal to n+1. Therefore, by sampling the output of the counter 270 at different phases, the processor 298 may receive three separate digital representations (e.g., C1, C2, and C3 outputs) of the duration of the enable period, based on which the processor can more accurately determine the duration as compared to only using a digital value at the output of the counter 270.

While only three sampling circuits are described to facilitate understanding, any number of multiple sampling circuits may be used. For example, six sampling circuits may be used, each configured to receive an RO signal from a different tap of the RO 202. Increasing the number of sampling circuits increases the accuracy of measurement of the duration of the enable period, allowing for a more accurate jitter measurement by the processor 298. Moreover, while the sampling circuits 280, 282, 284 are used to sample the output of the counter 270 based on RO signals at respective taps 218, 220, 222, the sampling circuits may be configured to sample the output of the counter 270 based on a different combination of taps of the RO.

Figure 4:
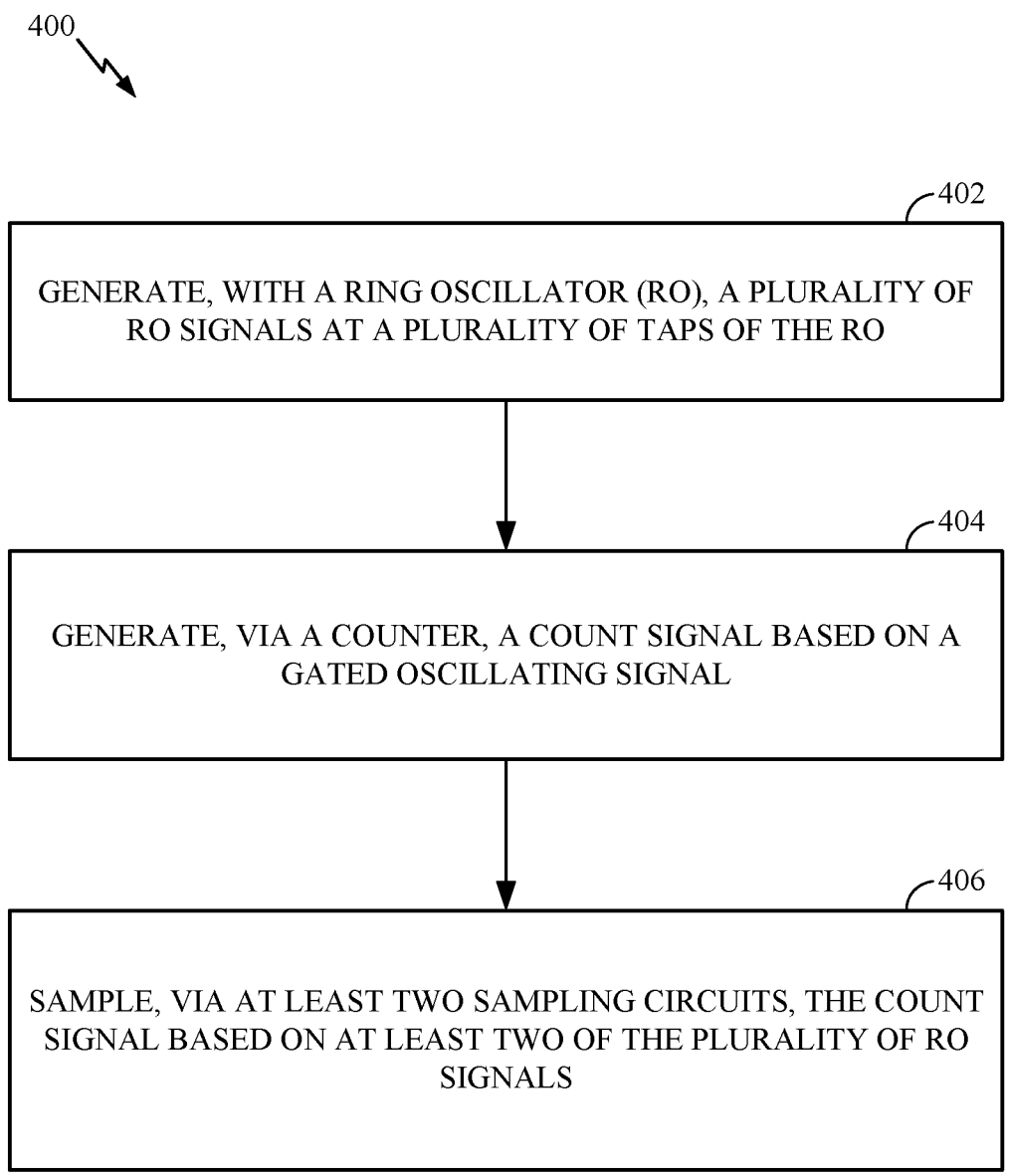
FIG. 4 is a flow diagram illustrating example operations for time-to-digital conversion, in accordance with certain aspects of the present disclosure.

FIG. 4 is a flow diagram illustrating example operations 400 for time-to-digital conversion, in accordance with certain aspects of the present disclosure. The operations 400 may be performed by a TDC, such as the TDC 200.

The operations 400 begin, at block 402, with a RO of the TDC generating a plurality of RO signals at a plurality of taps of the RO (e.g., RO 202). At block 404, the TDC generates (e.g., via counter 270) a count signal based on a gated oscillating signal (e.g., at RO output 234), and at block 406, samples (e.g., via sampling circuits 280, 282, 284) the count signal based on at least two of the plurality of RO signals.

In certain aspects, the oscillating signal may include one of the plurality of RO signals. In certain aspects, the TDC may set (e.g., via logic such as NAND gate 262) the gated oscillating signal to represent one of the plurality of RO signals based on an enable signal (e.g., at enable node 264). In certain aspects, setting the oscillating signal may include performing a NAND logic operation based on the enable signal and the one of the plurality of RO signals. In certain aspects, the TDC selects (e.g., via multiplexer 204) the one of the plurality of RO signals.

In certain aspects, the TDC applies a delay (e.g., via delay element 258) to one of the plurality of RO signals used to sample the count signal via one of the at least two sampling circuits. In some cases, the one of the RO signals may be considered as a 0° phase RO signal.

In certain aspects the TDC may measure (e.g., via processor 298) a jitter associated with the RO based on output signals of the at least two sampling circuits. In some cases, the at least two sampling circuits may include three sampling circuits, and the at least two of the RO signals may include a 0° phase RO signal, a 120° phase RO signal, and a 240° phase RO signal.

The various illustrative circuits described in connection with aspects described herein may be implemented in or with an integrated circuit (IC), such as a processor, a digital signal processor (DSP), an application-specific integrated circuit (ASIC), a field-programmable gate array (FPGA), or other programmable logic device. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is also noted that the operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering. Means for generating may include an RO, such as the RO 202. Means for generating may also include logic, such as the NAND gate 262 and/or multiplexer 204. Means for generating may also include a counter, such as the counter 270. Means for sampling may include at least two sampling circuits, such as the sampling circuits 280, 282, 284.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A time-to-digital converter (TDC) comprising:
   a ring oscillator (RO) having a plurality of taps and configured to generate a plurality of RO signals at the plurality of taps;
   a counter having an input coupled to an oscillating node; and
   at least two sampling circuits, each having an input coupled to an output of the counter, wherein the at least two sampling circuits are configured to sample a count signal at the output of the counter based on at least two of the plurality of RO signals at the plurality of taps.

2. The TDC of claim 1, wherein a gated oscillating signal at the oscillating node comprises one of the plurality of RO signals.

3. The TDC of claim 1, further comprising logic coupled between the RO and the counter and configured to set a gated oscillating signal at the oscillating node to represent one of the plurality of RO signals based on an enable signal.

4. The TDC of claim 1, further comprising a NOT AND (NAND) gate having a first input coupled to an enable node, a second input coupled to one of the plurality of taps, and an output coupled to the oscillating node.

5. The TDC of claim 4, further comprising a multiplexer having inputs coupled to at least some of the plurality of taps of the RO and an output coupled to the second input of the NAND gate.

6. The TDC of claim 1, further comprising a delay element coupled between one of the plurality of taps and one of the at least two sampling circuits.

7. The TDC of claim 6, wherein the one of the plurality of taps is considered as a 0° phase tap of the RO.

8. The TDC of claim 1, further comprising a processor configured to measure a jitter associated with the RO based on outputs of the at least two sampling circuits.

9. The TDC of claim 1, wherein the at least two sampling circuits comprise three sampling circuits configured to sample the count signal at the output of the counter based on a 0° phase tap of the RO, a 120° phase tap of the RO, and a 240° phase tap of the RO.

10. A method for time-to-digital conversion, comprising:
    generating, with a ring oscillator (RO), a plurality of RO signals at a plurality of taps of the RO;
    generating, via a counter, a count signal based on a gated oscillating signal; and
    sampling, via at least two sampling circuits, the count signal based on at least two of the plurality of RO signals.

11. The method of claim 10, wherein the gated oscillating signal comprises one of the plurality of RO signals.

12. The method of claim 10, further comprising setting, via logic, the oscillating signal to represent one of the plurality of RO signals based on an enable signal.

13. The method of claim 12, wherein setting the oscillating signal comprises performing a NOT AND (NAND) logic operation based on the enable signal and the one of the plurality of RO signals.

14. The method of claim 13, further comprising selecting, via a multiplexer, the one of the plurality of RO signals.

15. The method of claim 10, further comprising applying a delay to one of the plurality of RO signals used to sample the count signal via one of the at least two sampling circuits.

16. The method of claim 15, wherein the one of the RO signals is considered as a 0° phase RO signal.

17. The method of claim 10, further comprising measuring a jitter associated with the RO based on output signals of the at least two sampling circuits.

18. The method of claim 10, wherein the at least two sampling circuits comprise three sampling circuits, and wherein the at least two of the RO signals comprise a 0° phase RO signal, a 120° phase RO signal, and a 240° phase RO signal.

19. An apparatus for time-to-digital conversion, comprising:
   means for generating a plurality of oscillator signals;
   means for generating a count signal based on a gated oscillating signal; and
   means for sampling the count signal based on at least two of the plurality of oscillator signals.

20. The apparatus of claim 19, wherein the oscillating signal comprises one of the plurality of oscillator signals.

* * * * *